United States Patent
Moriyama et al.

(10) Patent No.: US 8,154,082 B2
(45) Date of Patent: Apr. 10, 2012

(54) SEMICONDUCTOR DEVICE AND MANUFACTURING METHOD THEREOF

(75) Inventors: Yoshihiko Moriyama, Tokyo (JP); Yoshiki Kamata, Tokyo (JP); Tsutomu Tezuka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 277 days.

(21) Appl. No.: 12/694,592

(22) Filed: Jan. 27, 2010

(65) Prior Publication Data
US 2010/0187503 A1    Jul. 29, 2010

(30) Foreign Application Priority Data
Jan. 29, 2009 (JP) ................................. 2009-018492

(51) Int. Cl.
*H01L 29/786* (2006.01)
*H01L 21/336* (2006.01)
(52) U.S. Cl. . 257/351; 257/401; 257/616; 257/E29.052; 438/284
(58) Field of Classification Search .................. 257/351, 257/401, 616, E29.052; 438/284
See application file for complete search history.

(56) References Cited

U.S. PATENT DOCUMENTS

| | | | | |
|---|---|---|---|---|
| 7,642,578 | B2 * | 1/2010 | Lee et al. ....................... | 257/288 |
| 7,923,314 | B2 * | 4/2011 | Tezuka et al. .................. | 438/157 |
| 7,960,791 | B2 * | 6/2011 | Anderson et al. ............. | 257/349 |

FOREIGN PATENT DOCUMENTS

| | | |
|---|---|---|
| JP | 5-226636 | 9/1993 |
| JP | 2005-526385 A | 9/2005 |
| JP | 2007-220809 | 8/2007 |
| JP | 2008-211052 A | 9/2008 |
| WO | WO 2009/151001 A1 | 12/2009 |

OTHER PUBLICATIONS

Japanese Office Action issued Jan. 4, 2011, in Patent Application No. 2009-018492 with English Translation.
Y.-J. Yang et al., "Electron mobility enhancement in strained-germanium n-channel metal-oxide-semiconductor field-effect transistors", Applied Physics Letters, vol. 91, 2007. (3 pages).
Tony Low et al., "Modeling Study of the Impact of Surface Roughness on Silicon and Germanium UTB MOSFETs", IEEE Transactions on Electron Devices, vol. 52, No. 11, Nov. 2005. (10 pages).

* cited by examiner

*Primary Examiner* — Minh-Loan T Tran
(74) *Attorney, Agent, or Firm* — Oblon, Spivak, McClelland, Maier & Neustadt, L.L.P.

(57) ABSTRACT

A semiconductor device includes an NMISFET region. The NMISFET region includes a Ge nano wire having a triangular cross section along a direction perpendicular to a channel current direction, wherein two of surfaces that define the triangular cross section of the Ge nano wire are (111) planes, and the other surface that define the triangular cross section of the Ge nano wire is a (100) plane; and an Si layer or an $Si_{1-x}Ge_x$ layer ($0 < x < 0.5$) on the (100) plane of the Ge nano wire.

7 Claims, 12 Drawing Sheets $H0 = HL < W \times \tan(54.74°) + 2d$
$H > W \times \tan(54.74°) + 2d$
(d=THICKNESS OF LATER FORMED GATE INSULATING FILM)

$H0 = HL < W \times \tan(54.74°) + 2d$
$H > W \times \tan(54.74°) + 2d$
(d=THICKNESS OF LATER FORMED GATE INSULATING FILM)

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2009-18492, filed on Jan. 29, 2009; the entire contents of which are incorporated herein by reference.

BACKGROUND OF THE INVENTION

1. Field of the Invention

The present invention relates to a semiconductor device and a manufacturing method thereof.

2. Description of the Related Art

Regarding carrier mobility in germanium (Ge), it is known, as described in a technical reference document, Y. J. Yang et al., Appl. Phys. Lett. vol. 91, pp. 102103-1-3, that the electron mobility decreases in the order: (111) plane>(110) plane (<–110> direction)>(100) plane>(110) plane (<00-1> direction). In addition, as described in another technical reference document, T. Low et al., IEEE Trans. Electron Devices vol. 52, pp. 2430-9, the hole mobility decreases in the order: (110) plane>(111) plane>(100) plane. It is also known that P-type and N-type Ge channel MISFETs can attain the highest mobility when the current flow is in the <110> direction.

JP-A 2007-220809 (KOKAI) proposes a high-driving-force Ge nano wire MISFET that is fabricated by oxidation and concentration method and has a cross section that is a symmetrical polygon, where four or more of the planes forming the polygon are (111) planes. This nano-wire MISFET has a (111)-plane channel in which the current flows in the highest-mobility <110> direction. However, there is a problem that this MISFET also has a (100)-plane which provides lower channel mobility than that achievable on the (111) plane.

Meanwhile, JP-A 5-226636 (KOKAI) proposes, as a method of forming a (111)-plane channel, anisotropic selective etching by use of an etching protective layer and an etching solution.

Although JP-A 5-226636 (KOKAI) discloses a technique of forming an Si (111) channel region on an Si (100) substrate by anisotropic etching with an alkaline solution, it does not disclose Ge anisotropic etching and a channel shape such as a nano-wire structure.

A manufacturing technology that simply adopts etching in a direction perpendicular to the substrate such as reactive ion etching (RIE) is not sufficient to realize fabrication of a three-dimensional MISFET such as a Ge channel MISFET, particularly an NMISFET, having a three-dimensional-structure channel such as a FinFET and a nano-wire MISFET in which the channel plane is the highest-mobility (111) plane and the current direction is the <110> direction, no matter what plane orientation the substrate has.

Because there has been no technology available for producing a single nano-wire MISFET having the above structure, as a matter of cause, there has been no technology available for offering a multi-wire structure in which MISFETs of such a type are layered.

SUMMARY OF THE INVENTION

According to one aspect of the present invention, a semiconductor device includes an NMISFET region. The NMISFET region includes a Ge nano wire having a triangular cross section along a direction perpendicular to a channel current direction, wherein two of surfaces that define the triangular cross section of the Ge nano wire are (111) planes, and the other surface that define the triangular cross section of the Ge nano wire is a (100) plane; and an Si layer or an $Si_{1-x}Ge_x$ layer (0<x<0.5) on the (100) plane of the Ge nano wire.

According to another aspect of the present invention, a method of manufacturing a semiconductor device includes forming a second layer on a first layer, the first layer being a Ge layer or a GOI layer, the second layer being an Si layer or an $Si_{1-x}Ge_x$ layer (0<x<0.5); etching the first layer and the second layer to form a fin structure; and performing anisotropic etching on the first layer by using the second layer as a mask.

DETAILED DESCRIPTION OF THE INVENTION

Figure 1:
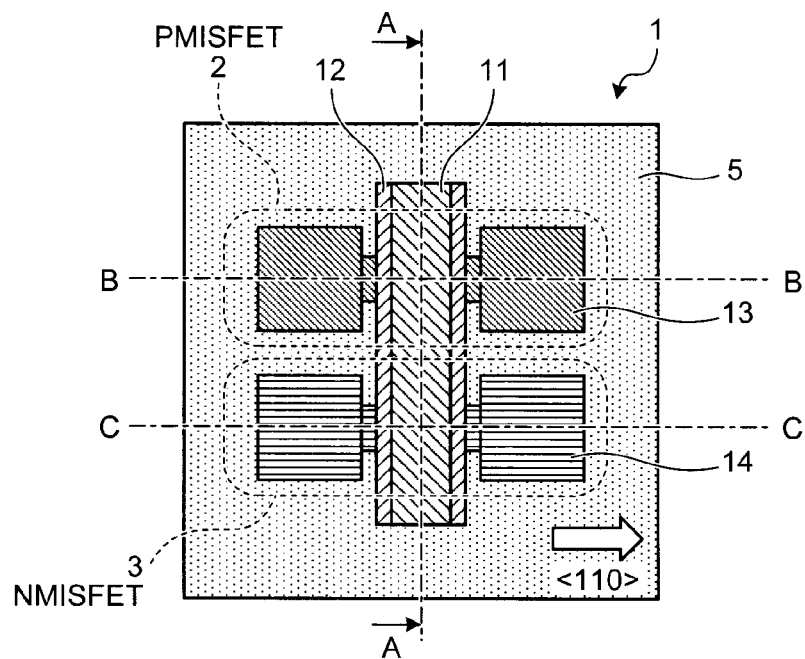
FIG. 1 is a top view of a semiconductor device according to the first embodiment.

Exemplary embodiments of a semiconductor device and a manufacturing method thereof according to the present invention are explained in detail below with reference to the attached drawings.

First Embodiment

A semiconductor device according to a first embodiment is explained with reference to FIGS. 1 to 4. In the semiconductor device illustrated in FIGS. 1 to 4, the current flows in the <110> direction.

A semiconductor device 1 is a Ge complementary MISFET (CMISFET) including a Ge nano-wire NMISFET and a Ge fin PMISFET. The semiconductor device 1 includes a PMISFET region 2 and an NMISFET region 3. The PMISFET region 2 has a (110)-plane channel region, and the NMISFET region 3 has a (111)-plane channel region.

As structural components, the semiconductor device 1 includes a silicon substrate 4, a buried oxide (BOX) layer 5, GOI (germanium-on-insulator) layers 6, Si layers 7, Ge layers 8, a hard mask layer 9, gate insulating films 10, a gate electrode 11, gate side walls 12, a PMISFET source/drain part 13, and an NMISFET source/drain part 14.

Figure 2:
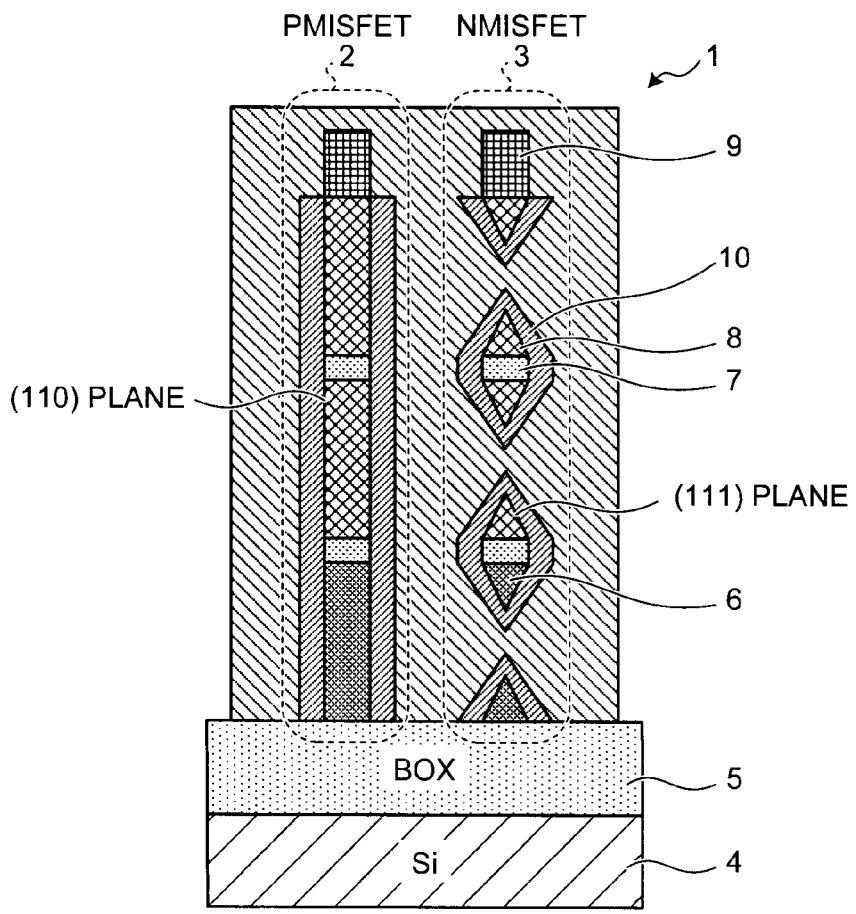
FIG. 2 is a section view viewed in the direction of arrows A-A of FIG. 1.
Figure 3:
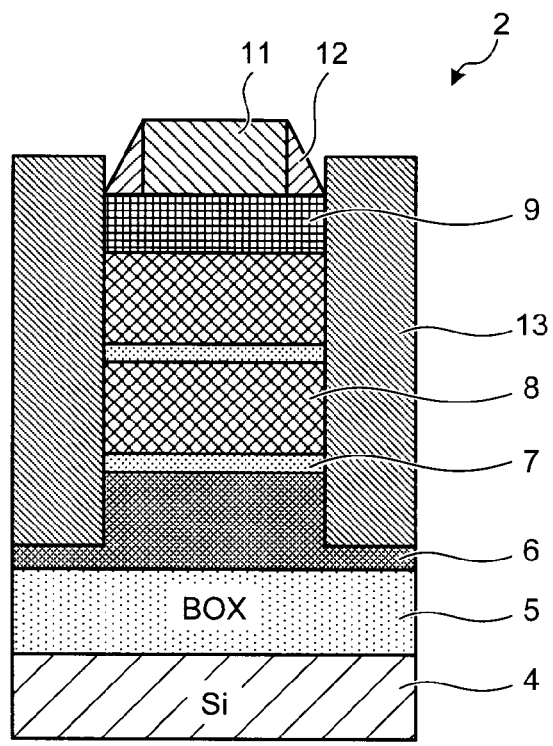
FIG. 3 is a section view along B-B of FIG. 1.
Figure 4:
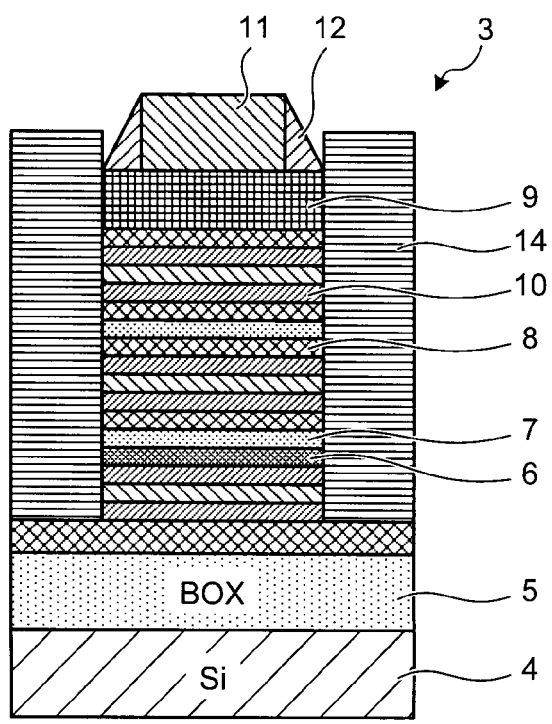
FIG. 4 is a section view along C-C of FIG. 1.
Figure 5:
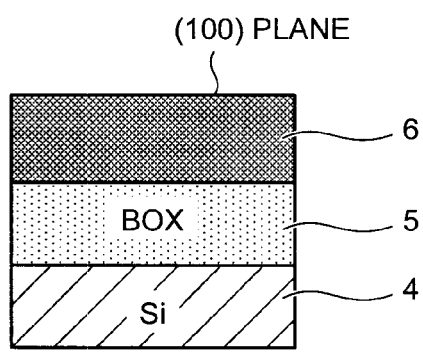
FIG. 5 is a section view of the semiconductor device in process after formation of a GOI layer.

As illustrated in FIG. 2, the PMISFET region 2 constitutes a Ge fin having the (110) surfaces. A cross sectional shape of each of the GOI layer 6 and the Ge layers 8 in the PMISFET region 2 in a direction perpendicular to the channel current direction is quadrangular, with its two facing surfaces being the (110) planes, and the other two surfaces being the (100) planes. More specifically, in the PMISFET region 2, Ge (110) planes are formed on two sides of the GOI layer 6 and of the Ge layers 8 to serve as a P channel.

The NMISFET region 3 constitutes Ge wires each having two (111) surfaces. A cross sectional shape of each of the GOI layers 6 and the Ge layers 8 in a direction perpendicular to the channel current direction is triangular. Two of the surfaces that form the triangular cross section are the (111) planes, and the other surface is the (100) plane. More specifically, in the NMISFET region 3, the two oblique surfaces of the GOI layer 6 on the top surface of the BOX layer 5, the two oblique surfaces of the Ge layer 8 on the bottom surface of the hard mask layer 9, the two oblique surfaces of each of the GOI layer 6 and the Ge layer 8 arranged on the bottom and top surfaces of the lower Si layer 7, and the two oblique surfaces of each of the Ge layers 8 arranged on the top and bottom surfaces of the upper Si layer 7 are Ge (111) planes that serve as an N-channel.

Such a structure can realize a Ge CMISFET provided with a PMISFET having the (110) planes, on which the hole mobility reaches the highest, as channel planes, and an NMISFET having the (111) planes, on which the electron mobility reaches the highest, as a channel planes, where the current flows in the <110> direction.

Next, the method of manufacturing the semiconductor device according to the present embodiment is explained with reference to the section views of FIGS. 5 to 12 illustrating process steps.

First, a bonded GOI substrate or a GOT substrate fabricated by commonly-used oxidation and concentration method is prepared. With the commonly-used oxidation and concentration method, a GOI substrate can be obtained by depositing an SiGe layer on an SOI substrate by chemical vapor deposition (CVD) or molecular beam epitaxy (MBE), and oxidizing the SiGe layer to increase the Ge concentration.

Figure 6:
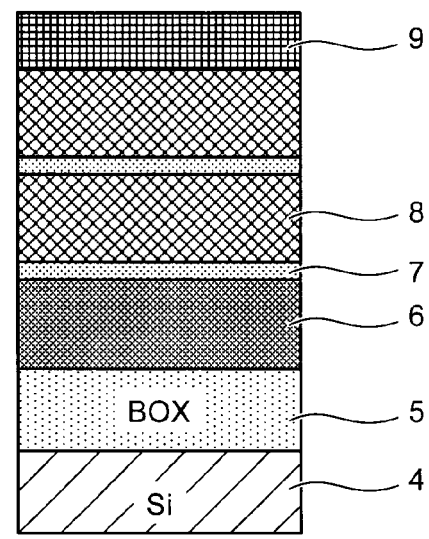
FIG. 6 is a section view of the semiconductor device in process after deposition of a hard mask layer.

Next, the Si layer 7 is deposited 1 to 5 nanometers thick on the GOI layer 6. The Si layer 7 is preferably formed as thin as possible, but the optimal thickness may be determined in consideration of interdiffusion with the Ge layer 8 and GOI layer 6 arranged above and below the Si layer 7. SiGe with low Ge composition ($Si_{1-x}Ge_x$, 0<x<0.5) may be used in place of Si. Thereafter, the Ge layer 8 is deposited on the Si layer 7 for approximately the same thickness as that of the GOI layer 6. Then, the process steps of depositing the Si layer 7 and of depositing the Ge layer 8 are repeated several times. In this example, the steps are repeated twice. Thereafter, the hard mask layer 9 is deposited on the uppermost Ge layer 8 by CVD or the like. FIG. 6 shows a cross section of the semiconductor device 1 after the deposition of the hard mask layer 9. In this example, the hard mask layer 9 is an Si dioxide film.

Figure 7:
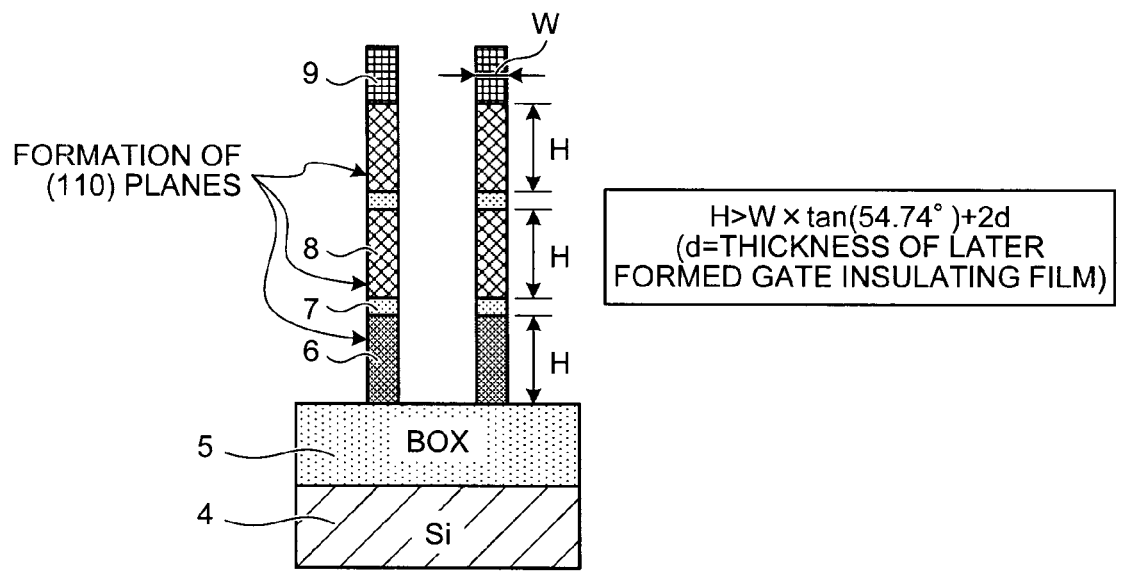
FIG. 7 is a section view of the semiconductor device in process after formation of a fin structure.

After a conventional lithographic process is completed, an RIE process, which is commonly used for fabrication of a fin structure, is performed to obtain the fin structure. FIG. 7 shows a cross section of the semiconductor device 1 after formation of the fin structure. At this process step, the Ge (110) planes that serve as a P-channel are formed in the Ge portions of the fin structure (the GOI layer 6 and the Ge layers 8) that later becomes the PMISFET region 2. When the fin width is W, the thickness of the GOI layer 6 and the Ge layer 8 is H, and the thickness of the gate insulating films 10 that are later formed is d, the fin is formed to satisfy H>W×tan (54.74°)+2d. Here, 54.74° is an angle formed by the (100) plane and the (111) plane. In this example, the fin width W is larger than 5 nanometers and smaller than 20 nanometers, and the thickness d of the gate insulating films 10 is larger than 1 nanometer and smaller than 10 nanometers.

Figure 8:
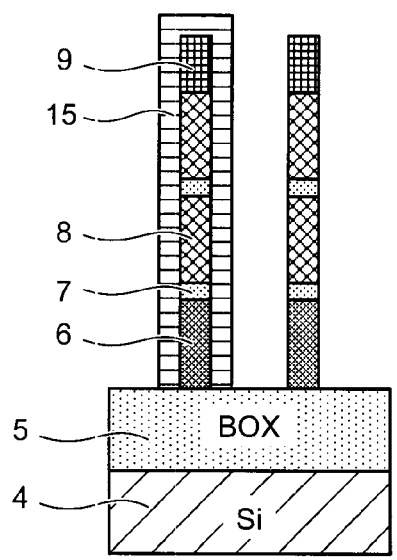
FIG. 8 is a section view of the semiconductor device in process after formation of an Si nitride film.

Next, a mask is formed, for example, with an Si nitride film 15 in the fin structure for the PMISFET region 2. FIG. 8 shows a cross section of the semiconductor device 1 after the formation of the Si nitride film 15.

Figure 9:
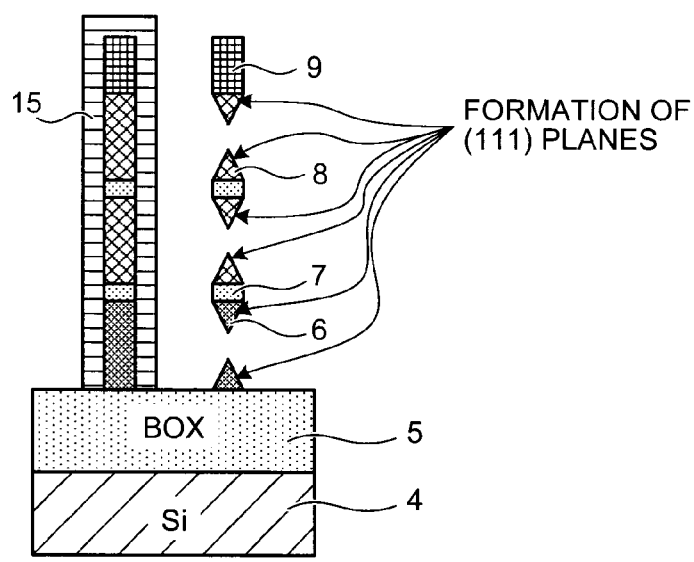
FIG. 9 is a section view of the semiconductor device in process after anisotropic etching.

Then, anisotropic etching is performed onto the Ge portions of the fin structure (the GOI layer 6 and the Ge layer 8) that serves as the NMISFET region 3 by use of a chemical solution such as hydrogen peroxide solution ($H_2O_2$) and TMAH (tetramethylammonium hydroxide) so that Ge (111) planes that later serve as an N-channel can be formed. FIG. 9 shows a cross section of the semiconductor device 1 after the anisotropic etching. This chemical solution may be in undiluted form, or may be diluted with pure water. When the solution is of a high concentration, the etching time should be reduced, and when the solution is of a low concentration, the etching time should be lengthened.

For Ge anisotropic etching, not only an alkaline etchant but also $H_2O_2$ can be employed, unlike for Si etching. The Si layer 7 interposed between the GOI layer 6 and the Ge layer 8 and the Si layer 7 interposed between the Ge layers 8 exhibit an etching rate far lower than the etching rates of the GOI layer 6 and the Ge layer 8, and therefore these Si layers 7 can be used as hard masks. Especially when $H_2O_2$ is used as an etchant, Si would not be easily etched. Hence, highly-selective anisotropic etching can be achieved.

Moreover, because the carrier mobility in the Si layers 7 is lower than that in the GOI layer 6 and the Ge layers 8, the Si layers 7 are used only as hard masks for this process step. Therefore, the Si layers 7 is preferably formed as thin as possible. In addition, because the fin structure is formed to satisfy H>W×tan(54.74°)+2d, the following six Ge nano wires each having two (111) surfaces can be formed: one Ge nano wire formed from the GOI layer 6 on the top surface of the BOX layer 5; one Ge nano wire formed from the Ge layer 8 on the bottom surface of the hard mask layer 9; two Ge nano wires formed from the GOI layer 6 and the Ge layer 8 arranged on the bottom and top surfaces of the lower Si layer 7, respectively; and two Ge nano wires formed from the two Ge layers 8 arranged on the top and bottom surfaces of the upper Si layer 7, respectively.

Figure 10:
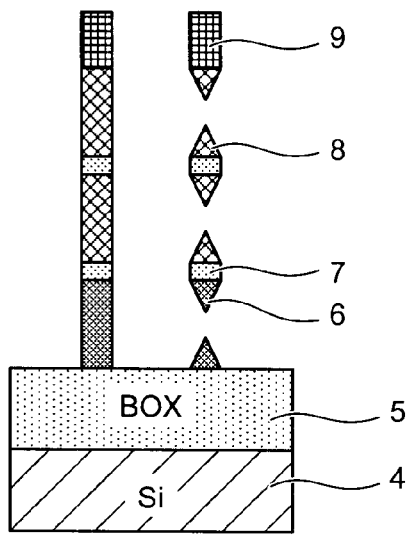
FIG. 10 is a section view of the semiconductor device in process after removal of the Si nitride film.

Next, the Si nitride film 15 is removed from the PMISFET region 2. FIG. 10 shows a cross section of the semiconductor device 1 after the removal of the Si nitride film 15. Here, the hard mask layer 9 in the topmost portion of the fin of the PMISFET region 2 should not be removed so that a channel would not be formed in the (100) plane which provides lower hole mobility than that achievable on the (110) plane. In a similar manner, the hard mask layer 9 in the topmost portion of the Ge nano wire in the NMISFET region 3 should not be removed so that a channel would not be formed on the (100) plane which provides lower electron mobility than that achievable on the (111) plane.

Figure 11:
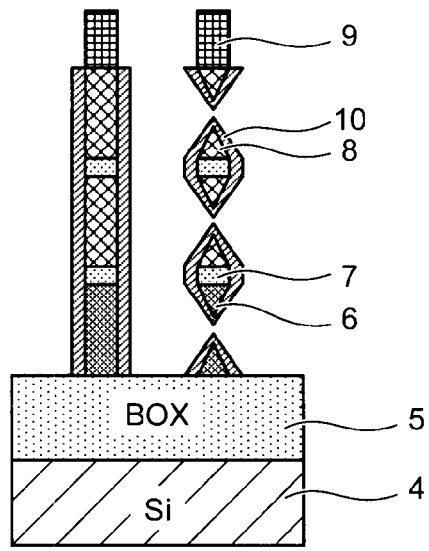
FIG. 11 is a section view of the semiconductor device in process after formation of a gate insulating film.

Next, the gate insulating films 10 are formed in the PMISFET region 2 and the NMISFET region 3. FIG. 11 shows a cross section of the semiconductor device 1 after the formation of the gate insulating films 10. As specified above, the thickness of the gate insulating films 10 is larger than 1 nanometer and smaller than 10 nanometers. For the gate insulating films 10, Si dioxide films, Si nitride films, or high-k insulating films are used. To form the gate insulating films 10, a deposition method using surface reaction such as CVD and atomic layer deposition (ALD) may be employed, or a method of depositing the films after performing an Si passivation treatment on the Ge surface by CVD may be employed.

Figure 12:
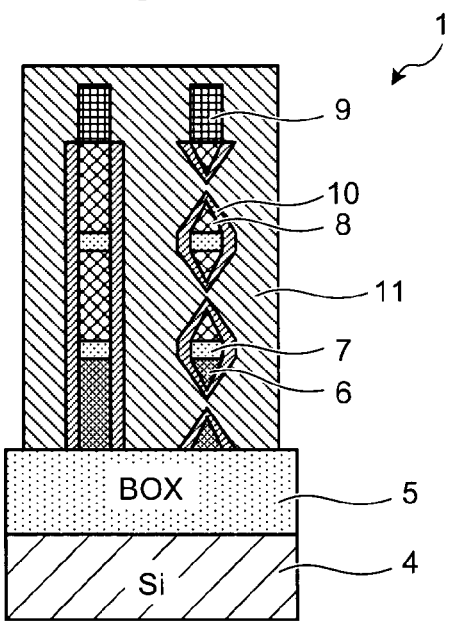
FIG. 12 is a section view of the semiconductor device in process after formation of a gate electrode.

Next, the gate electrode 11 is formed. FIG. 12 shows a cross section of the semiconductor device 1 after the formation of the gate electrode 11. For the gate electrode 11, any materials specifically required for a transistor according to its generation, such as poly-Si, poly-SiGe, silicide, germanide, germano-silicide, and various metals, may be selected.

Thereafter, the gate side walls 12 are formed. A commonly-used gate processing is used for the gate side walls 12.

Next, the PMISFET source/drain part 13 is deposited. To achieve further higher mobility, a material having a greater lattice constant than that of Ge such as GeSn may be deposited in the PMISFET source/drain part 13 so that a compressive strain can be applied to the P-channel portion. For the processing method, commonly-used CVD, MOCVD, or MBE may be employed, or Sn ion implantation and active annealing may be performed after deposition of Ge only. Doping of the PMISFET source/drain part 13 may be accomplished by ion implantation after the PMISFET source/drain part 13 is formed. If deposition is performed by CVD or the like, the PMISFET source/drain part 13 may be epitaxially doped with diborane or the like during the formation thereof.

Next, the NMISFET source/drain part 14 is deposited. To achieve further higher mobility, a material having a lattice constant smaller than that of Ge, such as SiGe, SiGeC, Si, and SiC, may be deposited in the NMISFET source/drain part 14 so that a tensile strain can be applied to the N-channel portion. In the same manner as the PMISFET source/drain part 13, a commonly-used technique such as CVD, MOCVD, and MBE may be adopted for the processing method. Especially when a C-containing material is used, C ions may be implanted and annealed for activation after deposition of SiGe or Si only. Doping of the NMISFET source/drain part 14 may be performed by ion implantation after formation of the NMISFET source/drain part 14. If the deposition is performed by CVD or the like, the NMISFET source/drain part 14 may be epitaxially doped with arsine or phosphine during the formation thereof.

Preferably, when forming the PMISFET source/drain part 13 and the NMISFET source/drain part 14, a strain is effectively applied to the channel regions, and an embedded source/drain structure is formed so that the parasitic resistance can be reduced. According to this technique, the source/drain region that is originally formed on the surface is etched in the depth direction of the substrate by RIE or the like, and the etched off space is filled with a material having a lattice constant different from that of the original material by selective growth method using CVD so that this portion can be used as a stressor that induces a strain. By designing the filled portion higher than the original substrate surface to obtain an elevated source/drain structure, a parasitic resistance can be reduced. After this embedded source/drain region is formed, a metal may be deposited on the top portion of the source/drain, and then annealed to form into a silicide, germanide, or germano-silicide. Then, the parasitic resistance can be further reduced.

Thereafter, a conventional CMISFET manufacturing process is performed to complete the semiconductor device 1.

The semiconductor device according to the present embodiment uses Si (low Ge content SiGe), which has the same crystalline structure as that of Ge but is not easily soluble in a Ge etching solution, as a hard mask material when etching Ge. As a result, the fabrication of a Ge/Si/Ge layered structure in a growth furnace of CVD or the like can be facilitated, and the integration in the vertical direction of the substrate can be readily increased.

With the structure of the semiconductor device according to the first embodiment, a Ge channel MISFET can be realized as a significantly fast CMISFET.

Second Embodiment

The semiconductor device according to the second embodiment has a structure partially different from that of the semiconductor device according to the first embodiment. The explanation on the structure of the semiconductor device according to the second embodiment illustrated in FIGS. 13 and 14 focuses on the difference with respect to the first embodiment. The rest of the structure is the same as the first embodiment. Thus, the above explanation should be referred to for the components of the same reference numerals, and the explanation is omitted here.

Figure 13:
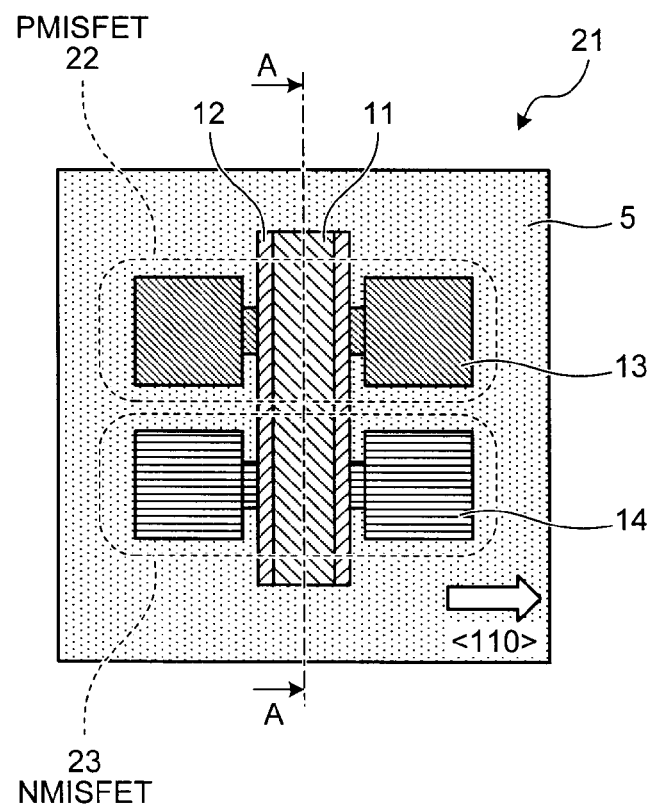
FIG. 13 is a top view of a semiconductor device according to the second embodiment.
Figure 14:
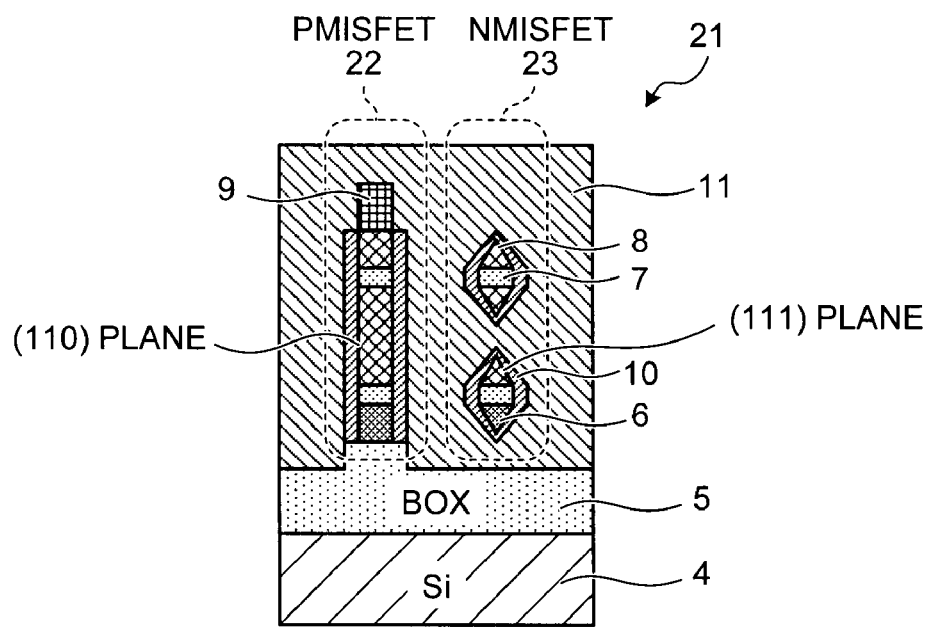
FIG. 14 is a section view viewed in the direction of arrows A-A of FIG. 13.

In FIGS. 13 and 14, the current flows in the <110> direction. A semiconductor device 21 is a Ge nano-wire CMISFET, including a PMISFET region 22 and an NMISFET region 23.

The PMISFET region 22 constitutes a Ge fin having the (110) surface. A cross sectional shape of each of the GOI layer 6 and the Ge layers 8 in the PMISFET region 22 along a direction perpendicular to the channel current direction is quadrangular. The two facing surfaces are the (110) planes, and the other two surfaces are the (100) planes. More specifically, in the PMISFET region 22, Ge (110) planes are formed on the two sides of the GOI layer 6 and the Ge layers 8 to serve as a P-channel.

The NMISFET region 23 constitutes Ge wires each having two (111) surfaces. A cross sectional shape of each of the GOI layer 6 and the Ge layers 8 along a direction perpendicular to the channel current direction is triangular. Two of the surfaces that form this triangular cross section are the (111) planes, and the other surface is the (100) plane. More specifically, in the NMISFET region 33, the two oblique surfaces of each of the GOI layer 6 and the Ge layers 8 arranged on the top and bottom surfaces of the Si layers 7 are Ge (111) planes that serves as an N-channel.

With such a structure, the Ge CMISFET can be provided with a PMISFET having the highest hole-mobility (110) planes as channel surfaces and an NMISFET having the highest electron-mobility (111) planes as channel surfaces. In addition, the current direction of this CMISFET is determined in the <110> direction.

As structural components, the semiconductor device 21 includes the silicon substrate 4, the BOX layer 5, the GOI layer 6, the Si layers 7, the Ge layers 8, the hard mask layer 9, the gate insulating films 10, the gate electrode 11, the gate side walls 12, the PMISFET source/drain part 13, and the NMISFET source/drain part 14.

Next, the method of manufacturing the semiconductor device 21 according to the present embodiment is explained with reference to the section views of FIGS. 15 to 19 illustrating process steps.

First, a bonded GOI substrate or a GOI substrate fabricated by a commonly-used oxidation and concentration method is prepared. With the commonly-used oxidation and concentration method, a GOI substrate can be obtained by depositing an SiGe layer on the SOI substrate by chemical vapor deposition (CVD) or molecular beam epitaxy (MBE), and oxidizing the SiGe layer to increase the Ge concentration.

Next, the Si layer 7 is deposited approximately 1 to 5 nanometers thick on the GOI layer 6. The Si layer 7 is preferably formed as thin as possible, but the optimal thickness may be determined in consideration of the interdiffusion with the Ge layer 8 and GOI layer 6 arranged above and beneath the Si layer 7. SiGe with low Ge composition ($Si_{1-x}Ge_x$, $0<x<0.5$) may be used in place of Si. Then, the Ge layer 8 is deposited on the Si layer 7 in such a manner as to be thicker than the GOI layer 6. The process steps of depositing the Si layer 7 and of depositing the Ge layer 8 are repeated several times, but the uppermost Ge layer 8 is formed to have the same thickness as that of the GOI layer 6. In this example, the process steps are repeated twice. Thereafter, the hard mask layer 9 is deposited on the uppermost Ge layer 8 by CVD or the like. In this example, the hard mask layer 9 is a Si dioxide film. Therefore, when the thickness of the GOI layer 6 is H0, the thickness of the subsequently deposited Ge layer 8 is H, and the thickness of the last deposited Ge layer 8 is HL, the structure is designed to satisfy H>H0=HL.

After a conventional lithographic process is completed, the RIE process, which is commonly used to fabricate a fin structure, is performed to obtain the fin structure. At this process step, a Ge (110) plane that serves as a P-channel is formed in the Ge portions of the fin structure (the GOI layer 6 and the Ge layers 8) that later becomes the PMISFET region 22. When the fin width is W, and the thickness of the gate insulating film 10 is d, the fin is designed to satisfy H0=HL<W×tan(54.74°)+2d and H>W×tan(54.74°)+2d. In this example, the fin width W is greater than 5 nanometers and smaller than 20 nanometers, and the thickness d of the gate insulating film 10 is greater than 1 nanometer and smaller than 10 nanometers.

Figure 15:
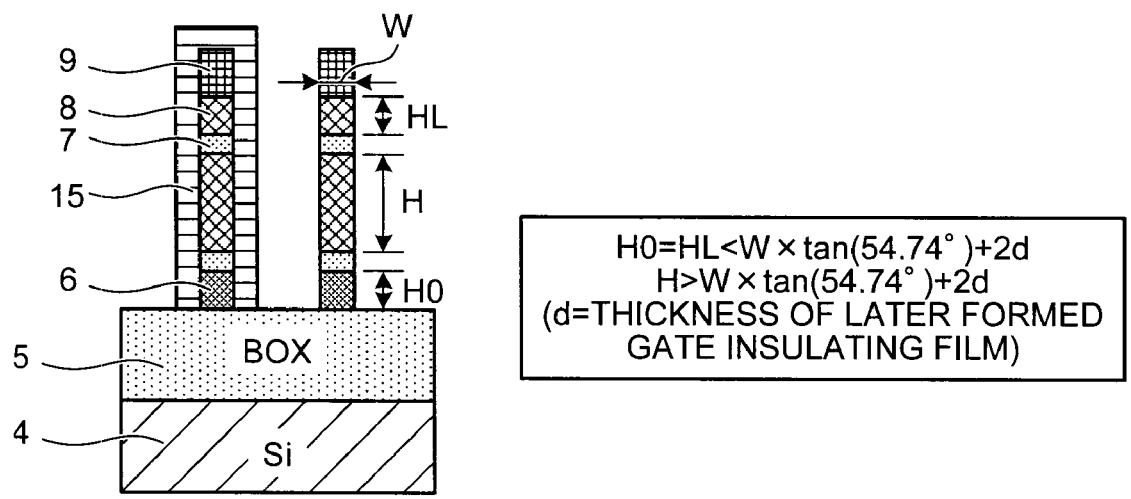
FIG. 15 is a section view of the semiconductor device in process after formation of an Si nitride film.

Next, a mask is formed with the Si nitride film 15 in the fin structure of the PMISFET region 22. FIG. 15 shows a cross section of the semiconductor device 21 after the formation of the Si nitride film 15. The manufacturing process up to this step is the same as the manufacturing process for the semiconductor device according to the first embodiment.

Figure 16:
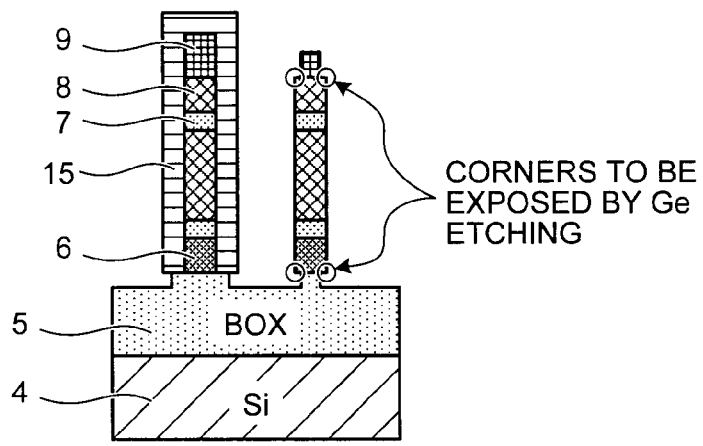
FIG. 16 is a section view of the semiconductor device in process after HF cleaning.

Next, HF cleaning (dilute hydrofluoric acid treatment) is performed to pierce through the BOX layer 5 and slim down the hard mask layer 9. FIG. 16 shows a cross section of the semiconductor device 21 after the HF cleaning. In actuality, the BOX layer 5 does not have to be completely pierced through. The etching is sufficiently conducted if the two corners of the uppermost portion of the fin that is the NMISFET region 23 and the two corners of the lowermost portion of the fin are exposed.

Figure 17:
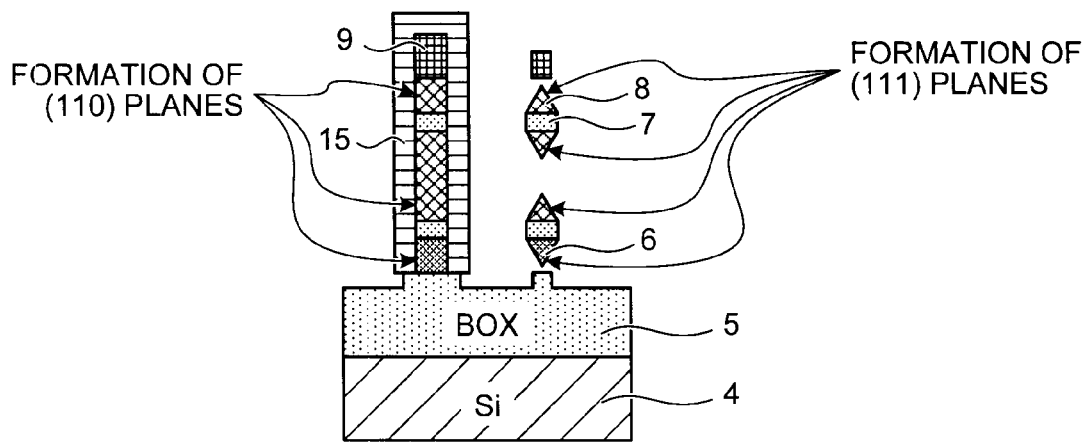
FIG. 17 is a section view of the semiconductor device in process after anisotropic etching.

Next, anisotropic etching is performed on the Ge portions (the GOI layer 6 and the Ge layers 8) of the fin structure that is the NMISFET region 23, by use of a chemical solution such as hydrogen peroxide solution ($H_2O_2$) and tetramethylammonium hydroxide (TMAH) to form Ge (111) planes that later serve as an N-channel. FIG. 17 shows a cross section of the semiconductor device 21 after the anisotropic etching. Because the Ge portions that have been exposed by the HF cleaning are most quickly etched off, a structure as illustrated in the drawing is obtained. The chemical solution may be in undiluted form, or may be diluted with pure water. If the concentration of the chemical solution is high, the etching time should be reduced, and if the concentration of the chemical solution is low, the etching time should be lengthened.

For Ge anisotropic etching, not only an alkaline etchant but also $H_2O_2$ can be adopted, unlike Si etching. Because the Si layer 7 interposed between the GOI layer 6 and the Ge layer 8 and the Si layer 7 interposed between the Ge layers 8 have an etching rate far lower than the etching rates of the GOI layer 6 and the Ge layer 8, the Si layers 7 can be used as a hard mask material. Especially when $H_2O_2$ is used as an etchant, Si would not be easily etched, and thus highly selective anisotropic etching can be achieved.

In addition, because the carrier mobility in the Si layers 7 is lower than that in the GOI layer 6 and the Ge layer 8, the Si layers 7 are used only as a hard mask material at this process step. The Si layers 7 therefore is preferably formed as thin as possible. Because the fin structure is designed to satisfy H0=HL<W×tan(54.74°)+2d and H>W×tan(54.74°)+2d, the following four Ge nano wires each having two (111) surfaces can be formed: two Ge nano wires formed from the GOI layer 6 and the Ge layer 8 arranged on the bottom and top surfaces of the lower Si layer 7, respectively; and two Ge nano wires formed from the Ge layers 8 arranged on the top and bottom surfaces of the upper Si layer 7, respectively.

Thereafter, HF cleaning is performed once again so that the BOX layer 5 in the NMISFET region 23 is completely pierced through, and at the same time, the topmost hard mask layer 9 is removed from the NMISFET region 23.

Then, the Si nitride film 15 is removed from the PMISFET region 22. At this step, the uppermost hard mask layer 9 of the fin in the PMISFET region 22 should not be removed to prevent a channel from being formed on the low hole-mobility (100) plane.

Figure 18:
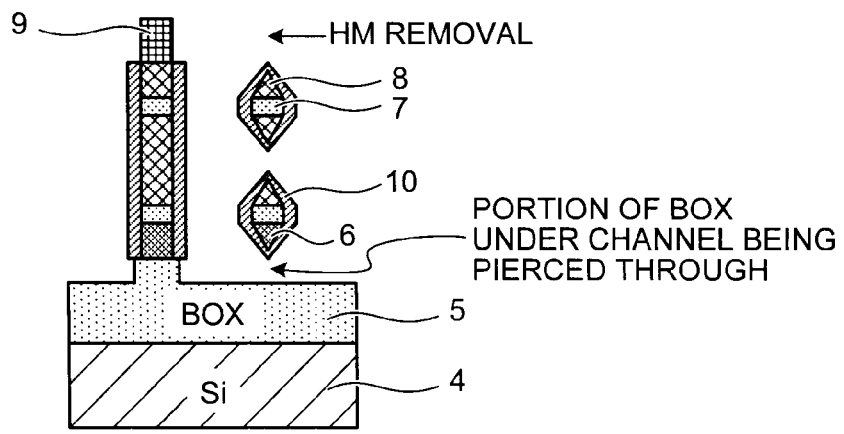
FIG. 18 is a section view of the semiconductor device in process after formation of a gate insulating film.

Next, the gate insulating films 10 are formed in the PMISFET region 22 and the NMISFET region 23. FIG. 18 shows a cross section of the semiconductor device 21 after the formation of the gate insulating films 10. As described above, the thickness of the gate insulating films 10 is determined to be greater than 1 nanometer and smaller than 10 nanometers. For the gate insulating films 10, Si dioxide films, Si nitride films, or high-k insulating films are used. For the formation of the gate insulating films 10, a deposition method using surface reaction such as CVD and atomic layer deposition (ALD), or a method with which the films are deposited after Si passivation treatment is performed onto the Ge surface by CVD or the like may be employed.

Figure 19:
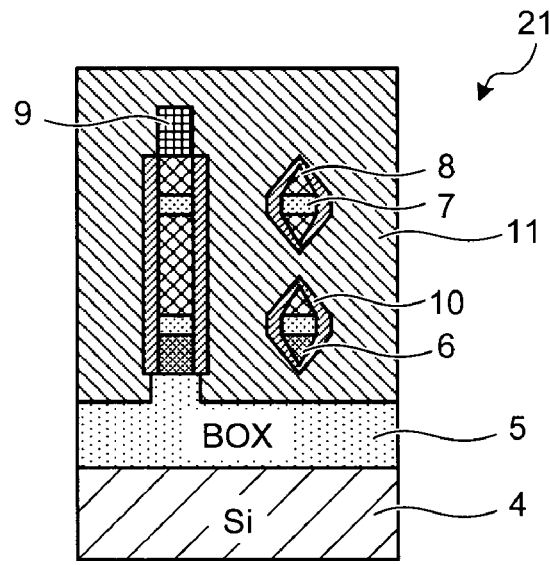
FIG. 19 is a section view of the semiconductor device in process after formation of a gate electrode.

Next, the gate electrode 11 is formed. FIG. 19 shows a cross section of the semiconductor device 21 after the formation of the gate electrode 11. Any materials specifically required for a transistor according to its generation, such as poly-Si, poly-SiGe, silicide, germanide, germano-silicide, and any metal may be selected for the gate electrode 11.

Thereafter, the gate side walls 12 are formed, and the PMISFET source/drain part 13 and the NMISFET source/drain part 14 are deposited. This process step is the same as that of the first embodiment, and thus the explanation is omitted.

Finally, the semiconductor device 21 is completed by use of a conventional CMISFET manufacturing process.

With the structure of the semiconductor device according to the second embodiment, a Ge channel MISFET can be realized as a significantly fast CMISFET.

Third Embodiment

In a semiconductor device according to the third embodiment, the PMISFET in the semiconductor device according to the first embodiment is configured to have a wire structure in the same manner as the NMISFET. The third embodiment is explained with reference to the attached drawings. The explanation of the structure of the semiconductor device according to the present embodiment illustrated in FIGS. 20 and 21 focuses on the difference with respect to the first embodiment. The rest of the structure is the same as the first embodiment, and thus the above explanation should be referred to for the same reference numerals. Thus, the explanation thereof is omitted here.

Figure 20:
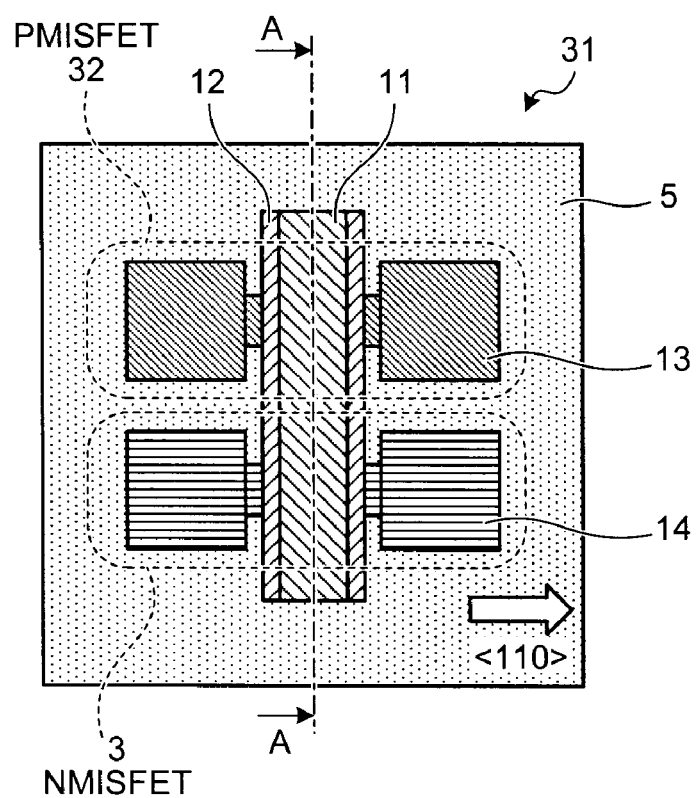
FIG. 20 is a top view of a semiconductor device according to the third embodiment.
Figure 21:
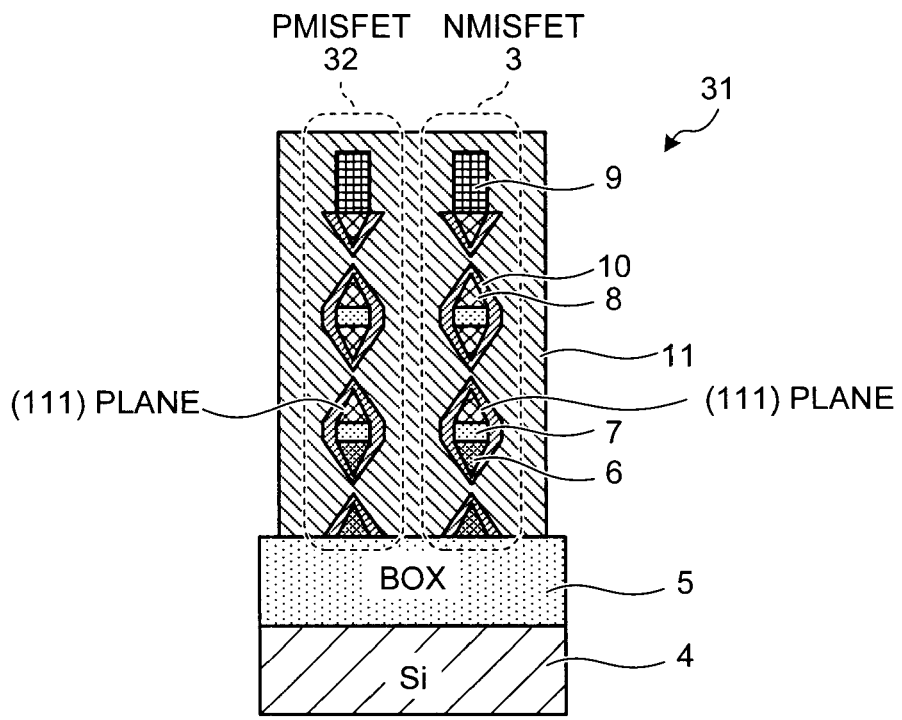
FIG. 21 is a section view viewed in the direction of arrows A-A of FIG. 20.

In FIGS. 20 and 21, the current flows in the <110> direction. A semiconductor device 31 is a Ge nano-wire CMISFET, and includes a PMISFET region 32 and the NMISFET region 3.

In the same manner as the NMISFET region 3, the PMISFET region 32 constitutes Ge nano wires each having two (111) surfaces. A cross sectional shape of each of the GOI layers 6 and the Ge layers 8 in a direction perpendicular to the channel current direction is triangular. Two of the surfaces that constitute the triangular cross section are the (111) planes, and the other surface is the (100) plane. More specifically, in the PMISFET region 32, the two oblique surfaces of the GOI layers 6 arranged on the top surface of the BOX layer 5, the two oblique surfaces of the Ge layer 8 on the bottom surface of the hard mask 9, the two oblique surfaces of each of the GOI layer 6 and the Ge layer 8 arranged on the bottom and top surfaces of the lower Si layer 7, and the two oblique surfaces of each of the Ge layers 8 arranged on the top and bottom surfaces of the upper Si layer 7 are Ge (111) planes that serve as a P-channel.

With such a structure, the NMISFET of the Ge CMISFET can realize the highest mobility as a Ge channel MISFET. The PMISFET of the CMISFET has a (111) plane channel, on which the mobility is not as high as on the (110) plane but is higher than on the (100) plane. In comparison with the semiconductor device according to the first embodiment, the mobility in the PMISFET region 32 is reduced, but the present embodiment is advantageous in that the nano wires of the P-type and N-type MISFETs can be simultaneously processed, and therefore that the number of manufacturing process steps can be reduced.

Furthermore, the semiconductor device 31 includes, as structural components, the silicon substrate 4, the BOX layer 5, the GOI layer 6, the Si layers 7, the Ge layers 8, the hard mask layer 9, the gate insulating films 10, the gate electrode 11, the gate side walls 12, the PMISFET source/drain part 13, and the NMISFET source/drain part 14.

Next, the method for manufacturing the semiconductor device 31 according to the present embodiment is explained with reference to FIGS. 22 to 25.

First, a bonded GOI substrate or a GOI substrate fabricated by a commonly-used oxidization and concentration method is prepared. With the commonly-used oxidization and concentration method, a GOI substrate can be obtained by depositing an SiGe layer on the SOI substrate by chemical vapor deposition (CVD) or molecular beam epitaxy (MBE), and oxidizing the SiGe layer to increase the Ge concentration.

Next, the Si layer 7 is deposited 1 to 5 nanometers thick on the GOI layer 6. The Si layer 7 is preferably formed as thin as possible, but the optimal thickness may be determined in consideration of interdiffusion with the Ge layer 8 and GOI layer 6 arranged above and underneath the Si layer 7. In place of Si, SiGe with low Ge composition ($Si_{1-x}Ge_x$, $0<x<0.5$) may be used. Further, the Ge layer 8 is deposited on the Si layer 7 to have approximately the same thickness as that of the GOI layer 6. Then, the process steps of depositing the Si layer 7 and of depositing the Ge layer 8 are repeated several times. In this example, the steps are repeated twice. Thereafter, the hard mask layer 9 is deposited on the topmost Ge layer 8 by CVD or the like. The hard mask layer 9 of this example is a Si dioxide film.

Figure 22:
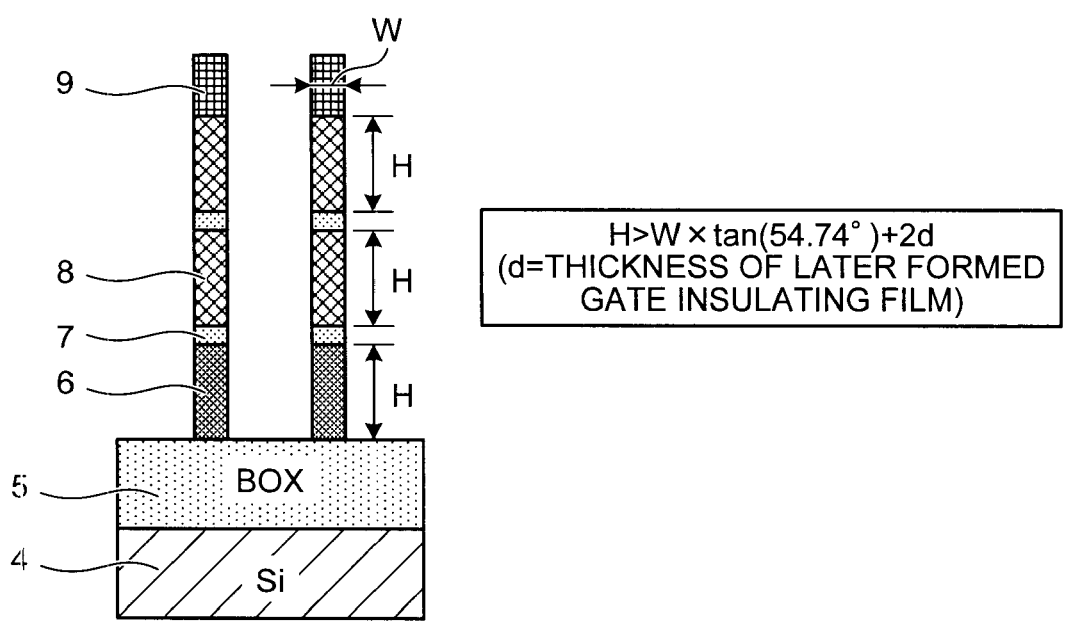
FIG. 22 is a section view of the semiconductor device in process after formation of a fin structure.

Then, after a conventional lithography process is performed, the RIE process, which is commonly used for fabrication of a fin structure, is performed to obtain the fin structure. FIG. 22 shows a cross section of the semiconductor device 31 after the fabrication of the fin structure. When the fin width is W, the thickness of the GOI layer 6 and the Ge layer 8 is H, and the thickness of the gate insulating film 10 is d, the fin is formed to satisfy $H>W \times \tan(54.74°)+2d$. In this example, the fin width W is greater than 5 nanometers and smaller than 20 nanometers, and the thickness d of the gate insulating film 10 is greater than 1 nanometer and smaller than 10 nanometers. Up to this step, the same procedure as the process for manufacturing the semiconductor device according to the first embodiment is followed.

Figure 23:
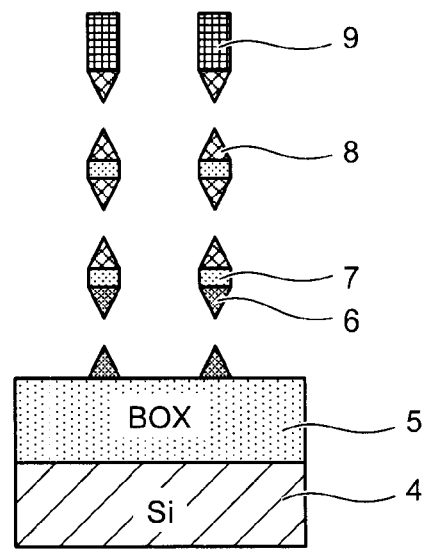
FIG. 23 is a section view of the semiconductor device in process after anisotropic etching.

Next, anisotropic etching is performed on the Ge portions the GOI layer 6 and the Ge layers 8) of the fin structure that serve as the PMISFET region 32 and the NMISFET region 3, by use of a chemical solution such as hydrogen peroxide solution ($H_2O_2$) and tetramethylammonium hydroxide (TMAH), so that Ge (111) planes that later become a P-channel and an N-channel can be formed. FIG. 23 shows a cross section of the semiconductor device 31 after anisotropic etching. The chemical solution may be used in undiluted form, or may be diluted with pure water. When the concentration of the chemical solution is high, the etching time should be reduced, while when the concentration of the chemical solution is low, the etching time should be lengthened.

When etching Ge, unlike etching Si, not only an alkaline etchant but also $H_2O_2$ can be used for anisotropic etching. Because the Si layer 7 interposed between the GOI layer 6 and the Ge layer 8 and the Si layer 7 interposed between the Ge layers 8 have an etching rate far lower than the etching rates of the GOI layer 6 and the Ge layer 8, the Si layers 7 can be used as a hard mask material. Especially when $H_2O_2$ is used as an etchant, Si would not be easily etched. Thus, highly selective anisotropic etching can be achieved.

In addition, because the carrier mobility in the Si layers 7 is lower than that in the GOI layer 6 and the Ge layers 8, the Si layers 7 are used only as a hard mask material at this process step. The Si layers 7 therefore is preferably formed as thin as possible. Because the fin structures are formed to satisfy H>W×tan(54.74°)+2d, in each of the PMISFET region 32 and the NMISFET region 33, the following six Ge nano wires each having two (111) surfaces can be formed: one Ge nano wire formed from the GOI layer 6 on the top surface of the BOX layer 5; one Ge nano wire formed from the Ge layer 8 on the bottom surface of the hard mask layer 9; two Ge nano wires formed from the GOI layer 6 and the Ge layer 8 arranged on the bottom and top surfaces of the lower Si layer 7, respectively; and two Ge nano wires formed from the two Ge layers 8 arranged on the top and bottom surfaces of the upper Si layer 7, respectively. Because the PMISFET region 32 and the NMISFET region 3 are fabricated at the same processing step, the number of steps can be reduced in comparison with the method with which they are separately fabricated.

Figure 24:
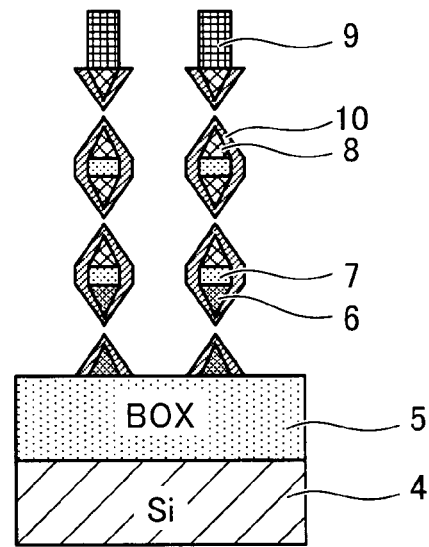
FIG. 24 is a section view of the semiconductor device in process after formation of a gate insulating film.

Next, the gate insulating films 10 are formed in the PMISFET region 32 and the NMISFET region 3. FIG. 24 shows a cross section of the semiconductor device 31 after the formation of the gate insulating films 10. As mentioned before, the thickness of the gate insulating films 10 is determined to be greater than 1 nanometer and smaller than 10 nanometers. For the gate insulating films 10, Si dioxide films, Si nitride films, or high-k insulating films are used. For the formation of the gate insulating films 10, deposition using surface reaction, such as CVD and atomic layer deposition (ALD), or a method of depositing the films after performing Si passivation treatment onto the Ge surface by CVD may be employed.

Figure 25:
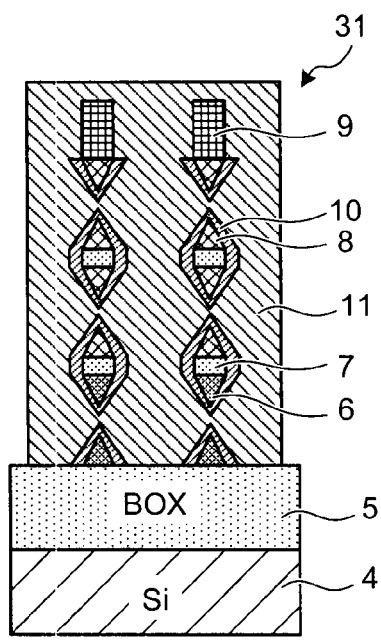
FIG. 25 is a section view of the semiconductor device in process after formation of a gate electrode.

Next, the gate electrode 11 is formed. FIG. 25 shows a cross section of the semiconductor device 31 after the formation of the gate electrode 11. For the gate electrode 11, any materials specifically required for a transistor according to its generation, such as poly-Si, poly-SiGe, silicide, germanide, germano-silicide, and various metals, may be used.

Thereafter, the gate side walls 12 are formed, and the PMISFET source/drain part 13 and the NMISFET source/drain part 14 are deposited. The procedure is the same as the process according to the first embodiment, and thus the explanation is omitted here.

Finally, the semiconductor device 21 is completed by use of a conventional CMISFET manufacturing process.

With such a structure of the semiconductor device according to the third embodiment, the processes for the nano wires of the P-type and N-type MISFETs can be simultaneously executed, and therefore the number of process steps can be advantageously reduced.

Fourth Embodiment

Figure 26:
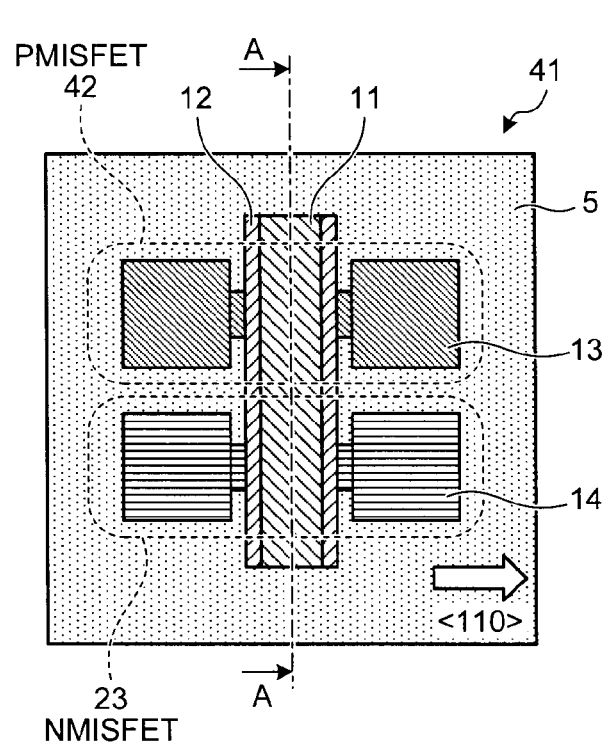
FIG. 26 is a top view of a semiconductor device according to the fourth embodiment.
Figure 27:
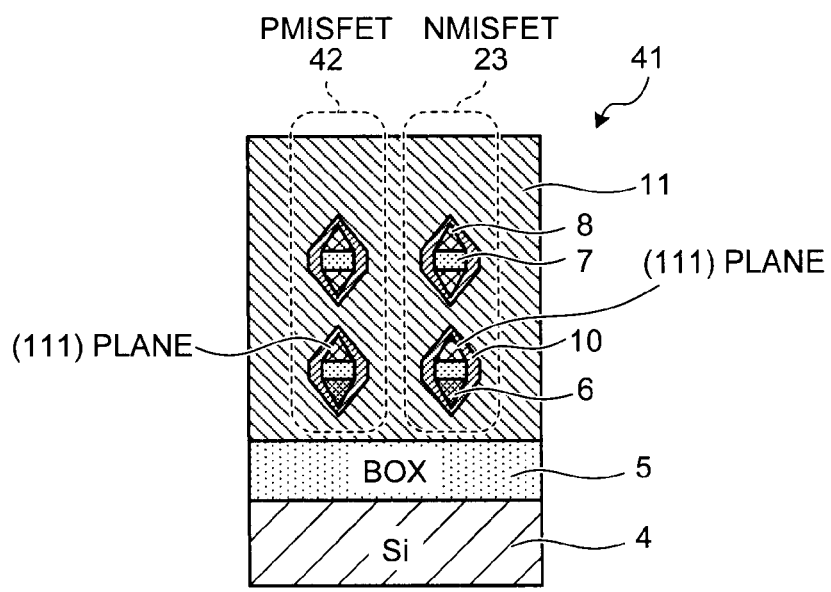
FIG. 27 is a section view of FIG. 26 viewed in the direction of arrows A-A.

In the semiconductor device according to the fourth embodiment, the PMISFET of the semiconductor device according to the second embodiment is configured to have the same structure as the wire structure of the NMISFET. The fourth embodiment is explained below with reference to the attached drawings. The structure of the semiconductor device according to the present embodiment illustrated in FIGS. 26 and 27 is explained, focusing on the difference with respect to the second embodiment. The rest of the structure is the same as the second embodiment. For components provided with the same reference numerals, the above explanation should be referred to, and the explanation is omitted here.

In FIGS. 26 and 27, the current flows in the <110> direction. A semiconductor device 41 is a Ge nano-wire CMISFET, including a PMISFET region 42 and the NMISFET region 23.

The PMISFET region 42 constitutes Ge wires each having two (111) surfaces. A cross sectional shape of each of the GOI layer 6 and the Ge layers 8 along a direction perpendicular to the channel current direction is triangular. Two of the surfaces forming the triangular cross section are the (111) planes, and the other surface is the (100) plane. More specifically, in the PMISFET region 42, the two oblique surfaces of each of the GOI layer 6 and the Ge layers 8 arranged on the top and bottom surfaces of the Si layers 7 are Ge (111) planes that serve as a P-channel.

With such a structure of the Ge CMISFET, the NMISFET can realize the highest mobility as a Ge channel MISFET. The PMISFET realizes a CMISFET having a (111) plane channel, on which the mobility is not as high as on the (110) plane but is higher than on the (100) plane. Although the mobility in the PMISFET region 42 is lower than the mobility in the equivalent region in the semiconductor device according to the second embodiment, the nano wires of the P-type and N-type MISFETs can be simultaneously processed. As a result, the number of process steps can be reduced.

Furthermore, the semiconductor device 41 includes, as its structural components, the silicon substrate 4, the BOX layer 5, the GOI layer 6, the Si layers 7, the Ge layers 8, the gate insulating films 10, the gate electrode 11, the gate side walls 12, the PMISFET source/drain part 13, and the NMISFET source/drain part 14.

Next, the method for manufacturing the semiconductor device according to the present embodiment is explained with reference to FIGS. 28 to 32.

First, a bonded GOI substrate or a GOI substrate fabricated by a commonly-used oxidation and concentration method is prepared. With the commonly-used oxidation and concentration method, the GOI substrate can be obtained by depositing an SiGe layer on the SOI substrate by chemical vapor deposition (CVD) or molecular beam epitaxy (MBE), and oxidizing the SiGe layer to increase the Ge concentration.

Next, the Si layer 7 is deposited 1 to 5 nanometers thick on the GOI layer 6. The Si layer 7 is preferably formed as thin as possible, but the optimal thickness may be determined in consideration of interdiffusion with the Ge layer 8 and GOI layer 6 arranged above and underneath the Si layer 7. In place of Si, low-Ge containing SiGe ($Si_{1-x}Ge_x$, 0<x<0.5) may be used. Furthermore, the Ge layer 8 is deposited on the Si layer 7 to have a greater thickness than that of the GOI layer 6. Then, the process steps of depositing the Si layer 7 and depositing the Ge layer 8 are repeated several times, and the topmost Ge layer 8 is formed to have the same thickness as that of the GOI layer 6. In this example, the steps are repeated twice. Thereafter, the hard mask layer 9 is deposited on the topmost Ge layer 8 by CVD or the like. The hard mask layer 9 of this example is a Si dioxide film. When the thickness of the GOI layer 6 is H0, the thickness of the Ge layer 8 deposited thereafter is H, and the thickness of the Ge layer 8 deposited last is HL, the structure is designed to satisfy H>H0=HL.

Figure 28:
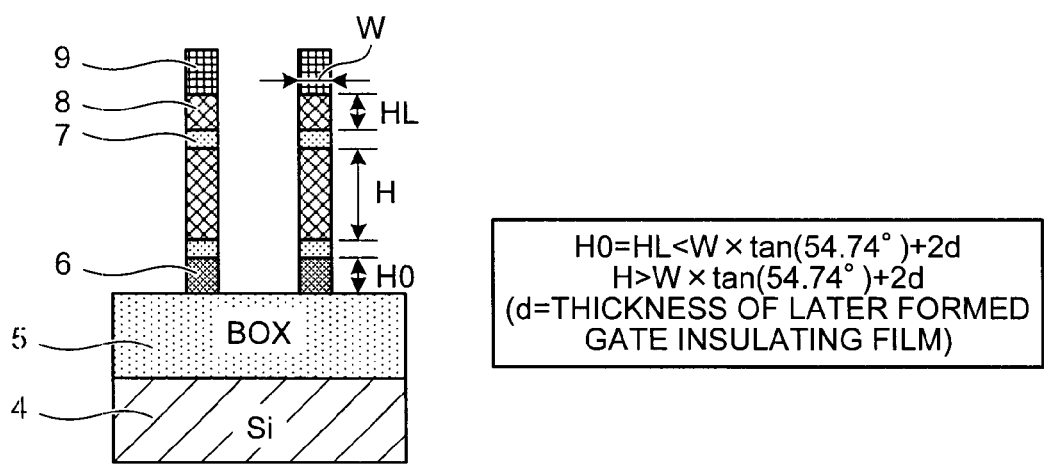
FIG. 28 is a section view of the semiconductor device in process after formation of a fin structure.

After a conventional lithographic process is performed, the RIE process, which is a commonly used method for fabricating a fin structure, is performed to obtain the fin structure. FIG. 28 shows a cross section of the semiconductor device 41 after formation of the fin structure. When the fin width is W, and the thickness of the gate insulating film 10 is d, the fin is fabricated to satisfy H0=HL<W×tan(54.74°)+2d and H>W×tan(54.74°)+2d. In the present example, the fin width W is greater than 5 nanometers and smaller than 20 nanometers, the thickness d of the gate insulating film 10 is greater than 1 nanometer and smaller than 10 nanometers. Up to this processing step, the same procedure as the method of manufacturing the semiconductor device according to the second embodiment is followed.

Figure 29:
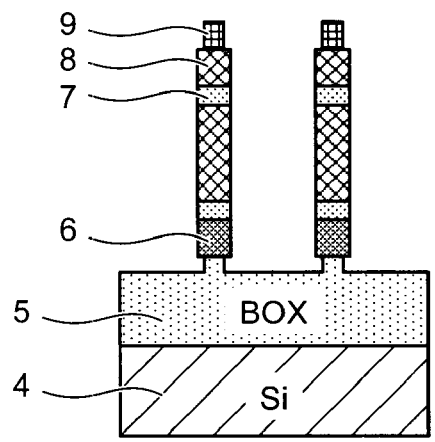
FIG. 29 is a section view of the semiconductor device in process after HF cleaning.

Then, HF cleaning (dilute hydrofluoric acid treatment) is performed to pierce through the BOX layer 5 and slim down the hard mask layer 9. FIG. 29 shows a cross section of the semiconductor device 41 after the HF cleaning. The BOX layer 5 actually does not have to be completely pierced through. Etching is sufficiently conducted if the topmost two corners of each of the fins that become the PMISFET region 42 and the NMISFET region 23 and the lowermost two corners of each of the fins are exposed.

Figure 30:
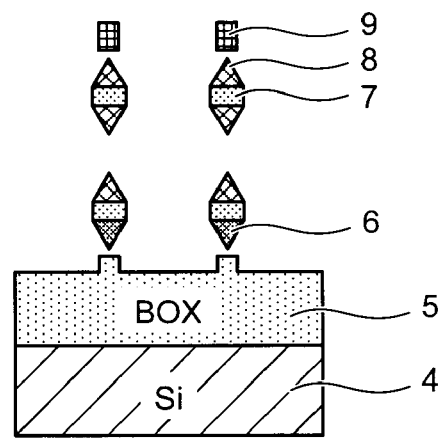
FIG. 30 is a section view of the semiconductor device in process after anisotropic etching.

Next, anisotropic etching is executed on the Ge portions (the GOI layers 6 and the Ge layers 8) of the fin structures that serve as the PMISFET region 42 and the NMISFET region 23, by use of a chemical solution such as hydrogen peroxide solution ($H_2O_2$) and tetramethylammonium hydroxide (TMAH) to create Ge (111) planes that later become a P-channel and an N-channel. FIG. 30 shows a cross section of the semiconductor device 41 after the anisotropic etching. The structure as illustrated in this drawing is obtained because the Ge portions that have been exposed by the HF cleaning are most quickly etched off. The chemical solution may be used in undiluted form, or may be diluted with pure water. If the concentration of the chemical solution is high, the etching time should be reduced. If the concentration of the chemical solution is low, the etching time should be lengthened.

When etching Ge, unlike etching Si, not only an alkaline etchant but also $H_2O_2$ can be used for anisotropic etching. Because the Si layer 7 interposed between the GOI layer 6 and the Ge layer 8 and the Si layer 7 interposed between the Ge layers 8 have an etching rate far lower than that of the GOI layer 6 and the Ge layer 8, they can be used as a hard mask material. Especially when $H_2O_2$ is adopted for the etchant, Si would not be easily etched. Thus, highly selective anisotropic etching can be realized.

In addition, the carrier mobility in the Si layers 7 is lower than that in the GOI layer 6 and the Ge layer 8, and thus the Si layers 7 are used only as a hard mask material for this process step. For this reason, the Si layers 7 is preferably formed as thin as possible. Because the fin structures are configured to satisfy H0=HL<W×tan(54.74°)+2d and H>W×tan(54.74°)+2d, in each of the PMISFET region 42 and the NMISFET region 43, the following four Ge nano wires each having two (111) surfaces can be formed: two Ge nano wires formed from the GOI layer 6 and the Ge layer 8 arranged on the bottom and top surfaces of the lower Si layer 7, respectively; and two Ge nano wires formed from the Ge layers 8 arranged on the top and bottom surfaces of the upper Si layer 7, respectively. Here, because the PMISFET region 42 and the NMISFET region 23 are formed at the same process steps, the number of steps can be reduced in comparison with the method with which these regions are separately formed.

Then, HF cleaning is performed once again to completely pierce through the BOX layer 5 in the PMISFET region 42 and the NMISFET region 23, and at the same time, to remove the topmost hard mask layers 9 from the PMISFET region 42 and the NMISFET region 23.

Figure 31:
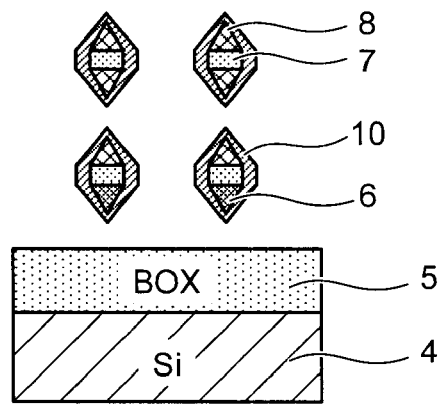
FIG. 31 is a section view of the semiconductor device in process after formation of a gate insulating film.

Next, the gate insulating films 10 are formed in the PMISFET region 42 and the NMISFET region 23. FIG. 31 shows a cross section of the semiconductor device 41 after formation of the gate insulating films 10. As mentioned above, the thickness of the gate insulating films 10 is greater than 1 nanometer and smaller than 10 nanometers. For the gate insulating films 10, Si dioxide films, Si nitride films, or high-k insulating films are used. For the formation of the gate insulating films 10, a deposition method using surface reaction such as CVD and atomic layer deposition (ALD) or a method with which the films are deposited after performing Si passivation treatment on the Ge surface by CVD may be employed.

Figure 32:
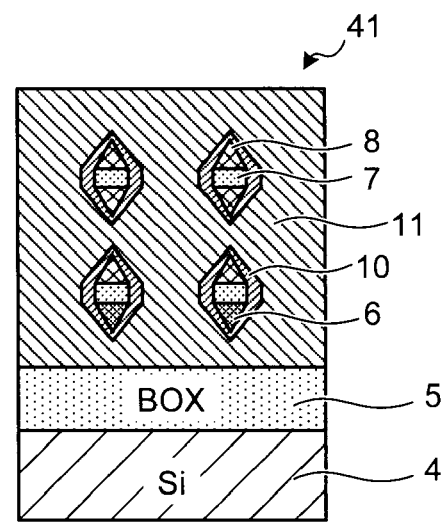
FIG. 32 is a section view of the semiconductor device in process after formation of a gate electrode.

Next, the gate electrode 11 is formed. FIG. 32 shows a cross section of the semiconductor device 41 after the formation of the gate electrode 11. Any materials specifically required for a transistor according to its generation, such as poly-Si, poly-SiGe, silicide, germanide, germano-silicide, and various metals, may be used for the gate electrode 11.

Thereafter, the gate side walls 12 are formed, and the PMISFET source/drain part 13 and the NMISFET source/drain part 14 are deposited. The procedure is the same as the method according to the first embodiment, and thus the detailed explanation is omitted.

Finally, the semiconductor device 21 is completed by use of a conventional CMISFET manufacturing process.

With the structure of the semiconductor device according to the fourth embodiment, the nano wire portions of the P-type and N-type MISFETs can be simultaneously processed, which reduces the number of manufacturing process steps.

The semiconductor device according to the first to fourth embodiments includes one PMISFET region and one NMISFET region. However, the device may include several regions for each type, and may include a larger number of NMISFET regions than that of PMISFET regions.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising an NMISFET region,
wherein the NMISFET region includes:
a Ge nano wire having a triangular cross section along a direction perpendicular to a channel current direction, wherein two of surfaces that define the triangular cross section of the Ge nano wire are (111) planes, and the other surface that define the triangular cross section of the Ge nano wire is a (100) plane; and
an Si layer or an $Si_{1-x}Ge_x$ layer (0<x<0.5) on the (100) plane of the Ge nano wire.

2. The semiconductor device according to claim 1, wherein:
the Ge nano wire includes two Ge nano wires; and
the Si layer or the $Si_{1-x}Ge_x$ layer (0<x<0.5) is formed between the (100) planes of the two Ge nano wires.

3. The semiconductor device according to claim 1, further comprising a PMISFET region, wherein:
the PMISFET region includes:
a Ge fin having a quadrangular cross section along the direction perpendicular to the channel current direction, wherein two facing surfaces that define the quadrangular cross section of the Ge fin are (110) planes, and other two facing surfaces that define the quadrangular cross section of the Ge fin are (100) planes; and
an Si layer or an $Si_{1-x}Ge_x$ layer (0<x<0.5) on at least one of the (100) planes of the Ge fin.

4. The semiconductor device according to claim 1, further comprising a PMISFET region, wherein:

the PMISFET region includes:
- Ge nano wire having a triangular cross section, wherein two of surfaces that define the triangular cross section of the Ge nano wire are (111) planes, and the other surface that define the triangular cross section of the Ge nano wire is a (100) plane; and
- an Si layer or an $Si_{1-x}Ge_x$ layer ($0<x<0.5$) on the (100) plane of the Ge nano wire.

5. A method of manufacturing a semiconductor device, comprising:
- forming a second layer on a first layer, the first layer being a Ge layer or a GOI layer, the second layer being an Si layer or an $Si_{1-x}Ge_x$ layer ($0<x<0.5$);
- etching the first layer and the second layer to form a fin structure; and
- performing anisotropic etching on the first layer by using the second layer as a mask.

6. The method of manufacturing the semiconductor device according to claim 5, further comprising forming a third layer on the second layer after the forming of the second layer, the third layer being a Ge layer, wherein:
- the forming of the second layer and the forming of the third layer are repeated at least once, and
- the etching includes etching the first layer, the second layer and the third layer.

7. The method of manufacturing the semiconductor device according to claim 5, further comprising performing HF cleaning before and after the anisotropic etching.

* * * * *